(12) United States Patent
Behlau et al.

(10) Patent No.: US 12,422,932 B2
(45) Date of Patent: Sep. 23, 2025

(54) ACTUATION DEVICE FOR A PUBLIC TRANSPORT VEHICLE

(71) Applicant: Airbus Operations GmbH, Hamburg (DE)

(72) Inventors: Gregor Behlau, Hamburg (DE); Ralph Gärtner, Hamburg (DE); Andreas Häussler, Hamburg (DE); Christian Schneider, Hamburg (DE); Christoph Schrock, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 761 days.

(21) Appl. No.: 17/556,197

(22) Filed: Dec. 20, 2021

(65) Prior Publication Data

US 2022/0179499 A1 Jun. 9, 2022

Related U.S. Application Data

(63) Continuation of application No. PCT/EP2020/065260, filed on Jun. 3, 2020.

(30) Foreign Application Priority Data

Jun. 28, 2019 (DE) ...................... 10 2019 209 522.4

(51) Int. Cl.
| | |
|---|---|
| *G06F 3/01* | (2006.01) |
| *B60Q 9/00* | (2006.01) |
| *B60R 15/04* | (2006.01) |
| *B61D 35/00* | (2006.01) |
| *E05F 15/73* | (2015.01) |
| *G05B 15/02* | (2006.01) |
| *G05G 1/02* | (2006.01) |

(52) U.S. Cl.
CPC ............. *G06F 3/017* (2013.01); *B60Q 9/00* (2013.01); *B60R 15/04* (2013.01); *B61D 35/002* (2013.01);

(Continued)

(58) Field of Classification Search
CPC .......... G06F 3/017; B60K 35/10; H03K 17/78
See application file for complete search history.

(56) References Cited

U.S. PATENT DOCUMENTS

| | | | |
|---|---|---|---|
| 2013/0297251 A1 | 11/2013 | Engel-Hall et al. | |
| 2017/0117891 A1* | 4/2017 | Lohbihler | .............. H03K 17/78 |

(Continued)

FOREIGN PATENT DOCUMENTS

| | | |
|---|---|---|
| DE | 37 25 777 C1 | 12/1988 |
| DE | 10 2010 049 400 A1 | 4/2012 |

(Continued)

OTHER PUBLICATIONS

International Search Report for Application No. PCT/EP2020/065260 dated Aug. 31, 2020.

(Continued)

*Primary Examiner* — Lam S Nguyen
(74) *Attorney, Agent, or Firm* — KDW Firm PLLC

(57) ABSTRACT

An actuation device for a public transport vehicle to avoid transmission of bacteria during the actuation. The device can be actuated by a predefined contactless actuation gesture, the device having a sensor unit that measures without contact and an evaluation unit, which is connected to the sensor unit. The sensor unit can generate a sensor signal transmit the sensor signal to the evaluation unit when an object, in particular a finger or a hand of a person, performs, within a detection space of the sensor unit, a movement at a distance from the actuation device, the signal being dependent on the movement sequence of the movement. The evaluation unit can check whether the movement is a predefined contactless actuation gesture, by which the actuation device can be actuated. If the movement is such an actuation gesture, a control signal is generated for a device of the vehicle.

20 Claims, 2 Drawing Sheets

(52) U.S. Cl.
CPC ............ *B61D 35/005* (2013.01); *E05F 15/73* (2015.01); *G05B 15/02* (2013.01); *E05F 2015/765* (2015.01); *E05Y 2400/44* (2013.01); *E05Y 2400/86* (2013.01); *E05Y 2900/51* (2013.01); *E05Y 2900/531* (2013.01); *G05G 1/02* (2013.01)

(56) References Cited

U.S. PATENT DOCUMENTS

| | | | |
|---|---|---|---|
| 2017/0270924 A1* | 9/2017 | Fleurence | .............. B60K 35/10 |
| 2019/0085600 A1 | 3/2019 | Leonardi et al. | |

FOREIGN PATENT DOCUMENTS

| | | | |
|---|---|---|---|
| DE | 10 2018 122443 | A1 | 3/2019 |
| DE | 10 2018 112443 | A1 | 11/2019 |

OTHER PUBLICATIONS

German Search Report for Application No. 102019209522 dated Mar. 8, 2021.

Microchip Technology Inc, "MGC3030/3130 3D Tracking and Gesture Controller Data Sheet", 2017, http://ww1.microchip.com/downloads/enDeviceDoc/40001667E.pdf, May 3, 2021.

Montanaro, L. et al, "A Touchless Human-Machine Interface for the Control of an Elevator", 2016, pp. 58-65.

* cited by examiner

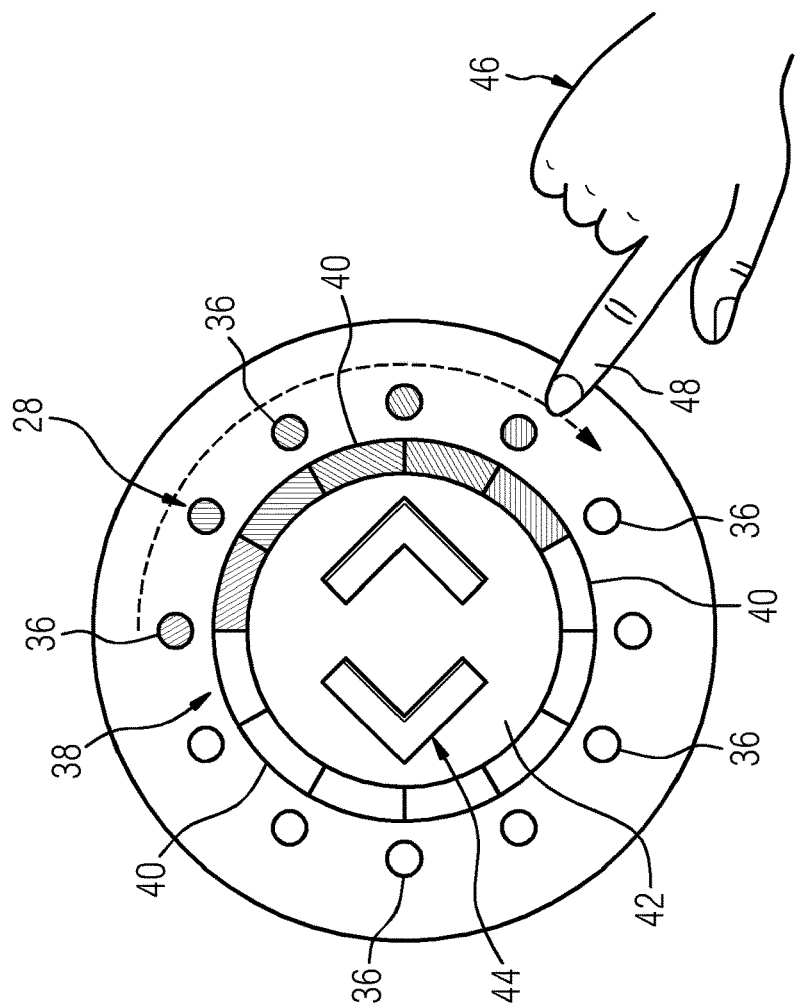
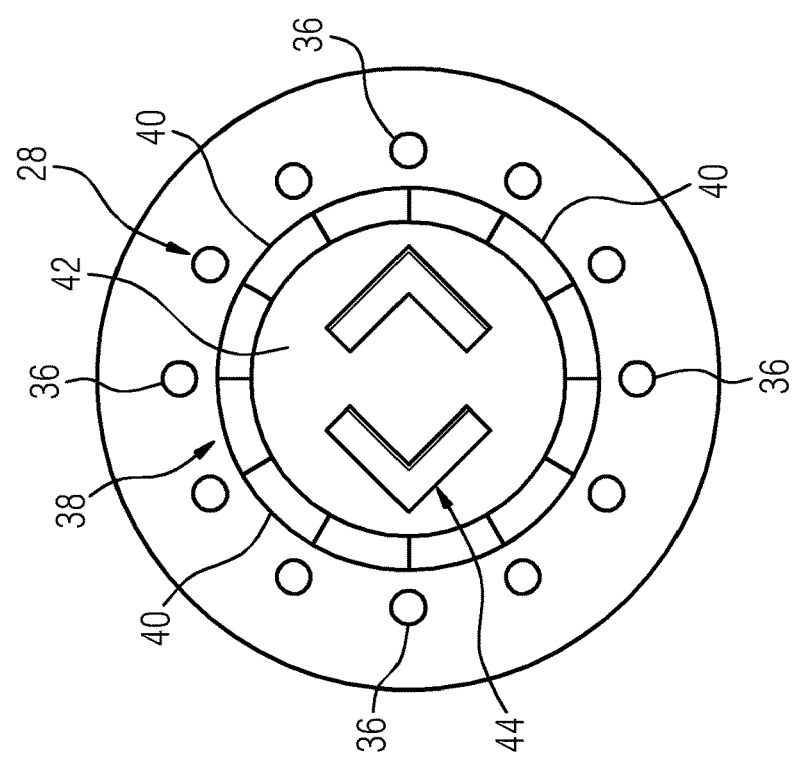

ACTUATION DEVICE FOR A PUBLIC TRANSPORT VEHICLE

CROSS-REFERENCE TO RELATED APPLICATIONS

This application is a continuation of and claims priority to Patent Application No. PCT/EP2020/065260 filed Jun. 3, 2020, which claims priority to German Patent Application No. 10 2019 209 522.4 filed Jun. 28, 2019, the entire disclosures of which are incorporated by reference herein.

TECHNICAL FIELD

The disclosure herein relates to an actuation device for a vehicle for public passenger transportation, to the uses thereof, and also to a vehicle for public passenger transportation having one or more actuation devices.

BACKGROUND

In vehicles for public passenger transportation, particularly in local or long-distance trains, actuation devices frequently come into operation for triggering vehicle devices, such as, for example, for activating a door drive for opening or closing a vehicle door, or for actuating a toilet flushing mechanism.

The actuation devices often take the form of push-buttons which have to be actuated by a passenger by finger pressure or palm pressure. A problematic aspect of actuation devices of such a type is that, by reason of the direct contact of the actuation devices with the fingers or hands of passengers, bacteria can easily be transferred from one passenger to another passenger. In order to reduce the bacterial transmission in the course of actuating actuation devices, in some vehicles for public passenger transportation, particularly in the sanitary rooms thereof, disinfectant dispensers come into operation, by which passengers are able to disinfect their hands.

SUMMARY

The object underlying the disclosure herein is to make it possible for a transmission of bacteria from one person to another person to be avoided in the course of actuating an actuation device, particularly in a vehicle for public passenger transportation.

In accordance with the disclosure herein, this object is achieved by an actuation device, by a vehicle, and also by uses as disclosed herein.

Preferred configurations of the disclosure herein are disclosed herein.

The actuation device according to the disclosure herein for a vehicle for public passenger transportation is capable of being actuated by a predetermined contactless actuation gesture. The actuation device exhibits a sensor unit measuring in contactless manner, as well as an evaluation unit connected to the sensor unit. The sensor unit has been set up to generate a sensor signal and to communicate the sensor signal to the evaluation unit when an object, in particular a finger or a hand of a person, is executing a motion at a distance from the actuation device within a detection space of the sensor unit, the signal being dependent on the sequence of movements of the motion. Furthermore, the evaluation unit has been set up to check, on the basis of the sensor signal, whether the motion executed by the object is a predetermined contactless actuation gesture by which the actuation device is capable of being actuated, and, if the motion executed by the object is such an actuation gesture, to generate a control signal for a device of the vehicle to be controlled.

By virtue of the fact that the actuation device is capable of being actuated by a predetermined contactless actuation gesture, it is possible to dispense with touching the actuation device for the purpose of its actuation. Consequently, a transmission of bacteria from one person to another person that is to be ascribed to a direct contact of the actuation device with the fingers or hands of persons can be avoided.

Erroneous triggering actions or erroneous actuations of the actuation device may be critical under certain circumstances, for instance if the actuation device is being used for opening a door, in particular a door of a sanitary room.

By virtue of the fact that, with the aid of the sensor unit and the evaluation unit, a check is made as to whether the motion executed by an object—such as, for example, a finger or a hand of a person—within the detection space of the sensor unit corresponds to a predetermined contactless actuation gesture, erroneous triggering actions or erroneous actuations of the actuation device can be avoided. The check makes it possible to ensure that the actuation device is only actuated in contactless manner if the motion carried out by the object corresponds to a predetermined contactless actuation gesture. In particular, it is possible in this way to prevent the actuation device from being actuated by an object—such as, for example, a person's backpack—that accidentally gets into the detection zone of the sensor unit.

The wording that the actuation device is capable of being actuated by a predetermined contactless actuation gesture is not necessarily to be understood to mean that the actuation device is capable of being actuated by a single predetermined contactless actuation gesture. Where appropriate, the actuation device may be capable of being actuated by a plurality of predetermined contactless actuation gestures.

In the present case, the "detection space of the sensor unit" is to be understood to mean a space within which the sensor unit can detect a motion of an object in contactless manner. The detection space of the sensor unit is not necessarily an individual contiguous zone. For example, the detection space may comprise several non-contiguous (partial) zones.

In the course of the check as to whether the motion executed by the object is a predetermined contactless actuation gesture, the evaluation unit preferentially compares the sensor signal with one or more reference signals stored in the evaluation unit, the reference signal or signals (each) having been assigned to a predetermined actuation gesture by which the actuation device is capable of being actuated. In preferred manner, the motion is classified as a predetermined contactless actuation gesture by which the actuation device is capable of being actuated if the sensor signal (generated as a function of the motion of the object) corresponds to at least one reference signal or lies within a predetermined tolerance range around a reference signal.

By virtue of the aforementioned control signal which is generated by the evaluation unit, the device to be controlled is expediently induced to execute a predetermined action.

The evaluation unit advantageously includes a processor, in particular a microprocessor, and a data memory. The evaluation unit has preferentially been set up by software, stored in the data memory and capable of being executed by the processor, to carry out the check and any other steps, in particular the steps described in the following.

The evaluation unit may have been arranged at the same location as the sensor unit. Alternatively, the evaluation unit may have been arranged to be remote from the sensor unit. Moreover, the evaluation unit may have been connected to one another in wireless manner, for instance via a radio link, or by cable.

Furthermore, there may be provision that the evaluation unit has been set up not only to evaluate sensor signals of the actuation device but also to evaluate signals of other devices of the vehicle. Where appropriate, the evaluation unit may have been set up to generate control signals also for these other devices of the vehicle.

In the sense of the disclosure herein, a predetermined contactless actuation gesture by which the actuation device is capable of being actuated is preferably not, for instance, a motion in the course of which the object is merely brought close up to the sensor unit, without touching it, and is then taken away from the sensor unit again. Advantageously, a predetermined contactless actuation gesture by which the actuation device is capable of being actuated includes, in between the bringing of the object close up to the sensor unit and the taking of the object away from the sensor unit, at least one predetermined motion component executed at a distance from the sensor unit, such as, for example, a circular or rectangular pattern of motion.

Moreover, the actuation device may have been realized so as to conform to TSI-PRM. This means the actuation device may have been realized in such a manner that the actuation device satisfies the requirements of European Regulation TSI-PRM.

In an advantageous embodiment of the disclosure herein, the actuation device exhibits a button by which the actuation device is capable of being actuated by exertion of pressure. With the aid of the button, the actuation device can, if desired, be actuated (as an alternative to an actuation via a predetermined contactless gesture) by exertion of pressure with the palm of the hand or with one or more fingers. The button can be utilized, for instance, if the sensor unit of the actuation device is defective or if a person, for whatever reason, is unable to actuate the actuation device by a predetermined actuation gesture.

In preferred manner, the sensor unit of the actuation device surrounds at least a partial region of the button.

The actuation device has advantageously been set up to generate a control signal for the device of the vehicle to be controlled when pressure is exerted on the button. In this connection it may, in particular, be a question of the same control signal as in the case of an actuation of the actuation device via a contactless actuation gesture.

Furthermore, the button may have been provided with a pictogram, in particular a raised pictogram. The pictogram expediently reflects the function of the actuation device. If the actuation device serves for activating a door drive, the pictogram may, for example, comprise an arrowhead directed to the left and an arrowhead directed to the right. If, on the other hand, the actuation device serves for activating a hand dryer, the pictogram may, for example, comprise several curved arrows which symbolize an airstream.

It is advantageous if the detection space of the sensor unit extends up to a distance of at most 10 cm, preferentially at most 7 cm, particularly preferably at most 5 cm, from the actuation device. In the case where the extent of the detection space of the sensor unit is adjustable, the maximum extent of the detection space has advantageously been set to one of the aforementioned values.

In preferred manner, the sensor unit comprises several juxtaposed sensors measuring in contactless manner which, in particular, may have been arranged to be equidistant from one another. The sensor unit may, for instance, comprise at least six sensors, preferentially at least eight sensors, particularly preferably at least ten sensors.

Each of the sensors of the sensor unit advantageously has its own detection zone. The detection space of the sensor unit is preferentially composed of the detection zones of the individual sensors.

In the present case, the "detection zone of a sensor of the sensor unit" is to be understood to mean a zone within which the respective sensor can detect a motion of an object in contactless manner.

The detection zones of the sensors may touch or overlap one another. In this, the detection space of the sensor unit constitutes an individual contiguous zone. Alternatively, the detection zones of the sensors may have been spaced from one another. In the latter case, the detection space of the sensor unit is not an individual contiguous zone but comprises several non-contiguous partial zones.

The respective sensor has advantageously been set up to generate a signal when the object is being guided through its detection zone. The aforementioned sensor signal which is generated by the sensor unit is preferentially based on the signals generated by the individual sensors.

Moreover, the evaluation unit may also have been set up to classify the motion of the object as a predetermined contactless actuation gesture by which the actuation device is capable of being actuated even when not every one of the sensors of the sensor unit detects a passage of the object through its detection zone.

The situation where not every one of the sensors detects a passage of the object through its detection zone may obtain, for instance, when the object is (inadvertently) not guided through the detection zone of one sensor or not guided through the detection zones of several sensors, or when one or more sensors is/are defective and consequently a passage through the respective detection zone cannot be detected.

The evaluation unit has preferentially been set up in such a manner that the motion of the object is classified by the evaluation unit as a predetermined contactless actuation gesture by which the actuation device is capable of being actuated only when at least one third of the sensors of the sensor unit, preferentially at least half of the sensors of the sensor unit, detect a passage of the object through their respective detection zone. As a result, it can be ascertained by the evaluation unit with sufficient accuracy or certainty whether the motion executed by the object is a predetermined contactless actuation gesture by which the actuation device is capable of being actuated.

Furthermore, the evaluation unit may have been set up in such a manner that the motion of the object is classified as a predetermined contactless actuation gesture by which the actuation device is capable of being actuated only when the timespan within which the motion takes place does not exceed a predetermined timespan of, for instance, 5 seconds.

The sensors of the sensor unit may, for instance, have been juxtaposed in the form of a circle. In this case, the actuation device is expediently capable of being actuated via a circular or substantially circular actuation gesture.

Furthermore, the evaluation unit may have been set up in such a manner that the direction of motion of the actuation gesture is arbitrary. As a result, both a motion of the object executed in clockwise manner and a motion of the object executed in counterclockwise manner can, for example, be classified as a predetermined contactless actuation gesture by which the actuation device is capable of being actuated.

In a preferred configuration of the disclosure herein, the sensors of the sensor unit are infrared sensors. Sensors of such a type have a good measuring sensitivity, are robust and, in addition, are available at favorable cost. Alternatively, the sensors of the sensor unit may be, for instance, capacitive sensors.

The actuation device may furthermore exhibit a visualization device, connected to the sensor unit, for visualizing the portion of the motion of the object detected by the sensor unit. In the course of the execution of a motion in the detection space of the sensor unit, the visualization device makes it possible for a person to recognize visually to what extent the actuation device has recognized a portion of the motion executed hitherto.

In preferred manner, the visualization device comprises several luminous devices. The luminous devices may, for instance, each have the shape of a ring segment, in which case the luminous devices may have been juxtaposed, in particular, in such a manner that the luminous devices together form a ring. The respective luminous device may, for instance, comprise one or more light-emitting diodes (LEDs) as lighting.

It is advantageous if the visualization device has been set up to cause the individual luminous devices to light up as a function of the sequence of movements of the motion of the object.

The visualization device has preferentially been set up to drive the luminous devices as a function of the sensor signal generated by the sensor unit.

At least one sensor, in particular precisely one sensor, of the sensor unit may have been assigned to each of the luminous devices. In this case, the visualization device may have been set up to cause the respective luminous device to light up when the object is being guided through the detection zone of a sensor of the sensor unit assigned to the respective luminous device.

The vehicle for public passenger transportation according to the disclosure herein exhibits one or more actuation devices according to the disclosure herein.

The vehicle may be, for instance, a rail vehicle, in particular a subway train, a streetcar or a railroad train. Alternatively, the vehicle may be, for example, an aircraft, a ship or a bus.

If the vehicle exhibits several actuation devices according to the disclosure herein, the actuation devices may, in particular, have differing functions. This means the actuation devices can be utilized, in particular, for driving various devices of the vehicle.

The control signal generated by the respective actuation device when it is actuated is expediently communicated to the respective device of the vehicle to be controlled. A wireless connection, in particular a radio link, or a cable-bound connection may come into operation for the signal communication.

In one use according to the disclosure herein of the actuation device according to the disclosure herein there is provision to use the actuation device in or on a sanitary room—such as, for example, a bathroom or washroom—of a vehicle for public passenger transportation, in particular for the purpose of activating a toilet flushing mechanism, for activating an outflow fitting of a washbasin, for activating a hand dryer or for opening and/or closing a door of the sanitary room.

In a further use according to the disclosure herein of the actuation device according to the disclosure herein in a vehicle for public passenger transportation there is provision to use the actuation device for activating a door drive for opening and/or closing a vehicle entry door.

Another use according to the disclosure herein of the actuation device according to the disclosure herein in a vehicle for public passenger transportation is the use of the actuation device for activating a flap drive for opening and/or closing a trash-can flap.

The trash can exhibiting the trash-can flap may be located, for example, in a sanitary room of the vehicle. Alternatively, the trash can may be located in another region of the vehicle.

Yet another use according to the disclosure herein of the actuation device according to the disclosure herein in a vehicle for public passenger transportation is the use of the actuation device for signaling a stop-request.

The description given hitherto of preferred configurations of the disclosure herein contains numerous features disclosed herein, in some cases combined severally. These features may, however, also be considered individually and may be combined to form meaningful further combinations. In particular, these features are each capable of being combined individually and in arbitrary suitable combination with the actuation device according to the disclosure herein, with the vehicle according to the disclosure herein and also with the uses according to the disclosure herein.

BRIEF DESCRIPTION OF THE DRAWINGS

The properties, features and advantages of the disclosure herein described above, and the manner in which they are achieved, will become clearer and more distinctly intelligible in connection with the following description of an example embodiment of the disclosure herein which will be elucidated in more detail in connection with the figures. The example embodiment serves for elucidation of the disclosure herein and does not restrict the disclosure herein to the combinations of features specified therein, not even with respect to functional features. In addition, features of the example embodiment that are suitable for this purpose may also be considered explicitly in isolation and may be combined with any one of the claims.

Shown are:

FIG. 2 one of the actuation devices of the vehicle in a front view;

FIG. 3 the actuation device from FIG. 2 and a hand of a person is executing a predetermined contactless actuation gesture for actuating the actuation device.

DETAILED DESCRIPTION

Figure 1:
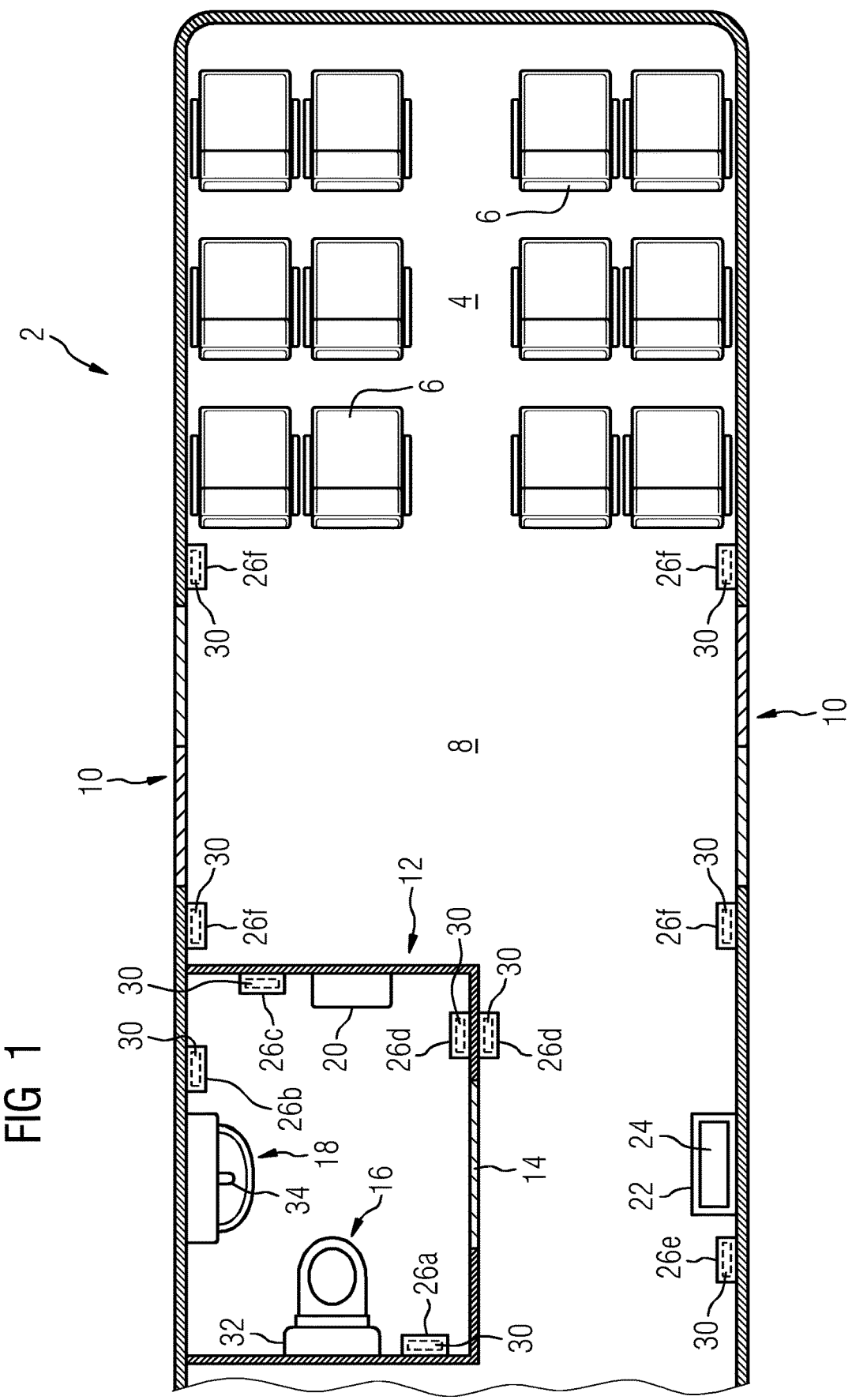
FIG. 1 a sectional representation of a portion of a vehicle that is equipped with several actuation devices.

FIG. 1 shows a partial region of a vehicle 2 for public passenger transportation in a sectional representation. In the present example embodiment, the vehicle 2 is, in particular, a rail vehicle.

In FIG. 1, a seating region 4 with several passenger seats 6, an entry/exit region 8 with two vehicle entry doors 10 arranged opposite one another, and also a sanitary room 12 of the vehicle 2 are illustrated.

The sanitary room 12 includes a sliding door 14 via which the sanitary room 12 can be entered and exited. Located in the sanitary room 12 are a toilet 16, a washbasin 18 and also a hand dryer 20 with a hot-air blower. Opposite the sliding door 14 of the sanitary room 12 the vehicle 2 exhibits a trash can 22 with a trash-can flap 24.

Moreover, the vehicle 2 is equipped with a plurality of actuation devices 26a-26f, each of which is capable of being actuated via a predetermined contactless actuation gesture. The actuation devices 26a-26f each include a sensor unit 28

(cf. FIG. 2 and FIG. 3) and an internal evaluation unit 30 connected to the sensor unit 28. In addition, the respective actuation device 26a-26f is arranged on a device of the vehicle 2 that is capable of being controlled by the respective actuation device 26a-26f.

A first actuation device 26a of the plurality of actuation devices 26a-26f has been provided for contactless activation of a toilet flushing mechanism 32 of the toilet 16. A second actuation device 26b of the plurality of actuation devices 26a-26f has been provided for contactless activation of an outflow fitting 34 of the washbasin 18. Furthermore, a third actuation device 26c of the plurality of actuation devices 26a-26f has been provided for contactless activation of the hand dryer 20. Two further actuation devices 26d of the plurality of actuation devices 26a-26f, one of which is arranged internally in the sanitary room 12, and the other externally on the sanitary room 12, serve for contactless activation of a door drive of the sliding door 14 of the sanitary room 12. With the aid of the two last-mentioned actuation devices 26d, the sliding door 14 of the sanitary room 12 can be opened and closed in contactless manner.

Another actuation device 26e of the plurality of actuation devices 26a-26f serves for contactless actuation of a flap drive of the trash-can flap 24 of the aforementioned trash can 22. By this actuation device 26e, the trash-can flap 24 can be opened and closed in contactless manner.

In addition, four further actuation devices 26f of the plurality of actuation devices 26a-26f serve for contactless activation of a door drive of the respective vehicle entry door 10. With the aid of these two actuation devices 26f, the vehicle entry doors 10 can be opened and closed in contactless manner.

FIG. 2 shows, by way of example, one of the actuation devices 26a-26f of the vehicle 2 in a front view. The following remarks apply in analogous manner to the other actuation devices 26a-26f of the vehicle 2.

As mentioned previously, the actuation device is equipped with a sensor unit 28. The latter comprises several sensors 36 measuring in contactless manner, each of which exhibits a detection zone which extends up to a distance of 5 cm from the actuation device and within which the respective sensor 36 can detect a motion of an object in contactless manner. Together, the detection zones of the sensors 36 form a detection space of the sensor unit 28, within which the sensor unit 28 can detect a motion of an object in contactless manner.

The sensors 36 have been positioned to be equidistant from one another and juxtaposed in the form of a circle. In the present example embodiment, the sensors 36 are infrared sensors, but capacitive sensors, for example, may come into operation alternatively instead of infrared sensors.

Moreover, the actuation device includes a visualization device 38 which comprises several luminous devices 40. The luminous devices 40 may, for instance, each exhibit one or more light-emitting diodes as lighting. The luminous devices 40 take the form of ring segments and are arranged in such a manner that the luminous devices 40 together form a ring.

Precisely one luminous device 40 of the visualization device 38 has been assigned to each of the sensors 36 of the sensor unit 28. In the present example embodiment, the actuation device exhibits twelve sensors 36 and twelve luminous devices 40, it being possible, in principle, for a higher or lower number of sensors 36 and a higher or lower number of luminous devices 40 to have been provided.

With the aid of its sensor unit 28 and its evaluation unit 30 (not represented in FIG. 2), the actuation device is capable of being actuated by a predetermined contactless actuation gesture. In the present example embodiment, the actuation device is capable of being actuated via a circular actuation gesture which can optionally be executed in clockwise or counterclockwise manner, in which connection the starting-point of the actuation gesture is capable of being chosen freely.

The sensor unit 28 has been set up to generate a sensor signal and to communicate the sensor signal to the evaluation unit 30 of the actuation device when an object—such as, for example, a finger of a person—is executing a motion at a distance from the actuation device within a detection space of the sensor unit 28. The signal is dependent on the sequence of movements of the motion.

The evaluation unit 30 has been set up to check, on the basis of the sensor signal, whether the motion executed by the object is the predetermined contactless actuation gesture by which the actuation device is capable of being actuated.

If the motion executed by the object corresponds to the predetermined contactless actuation gesture by which the actuation device is capable of being actuated, the evaluation unit 30 generates a control signal for the device of the vehicle 2 to be controlled by the actuation device, and communicates the control signal to the device.

In addition, the actuation device exhibits a circular button 42, by which the actuation device is capable of being actuated by exertion of pressure by a finger or a palm of the hand (instead of by a contactless actuation gesture). In the present case, the button 42 is surrounded both by the luminous devices 40 of the visualization device 38 and by the sensors 36 of the sensor unit 28.

The button 42 is provided with a raised pictogram 44 which renders the function of the actuation device graphically. In FIG. 2, the pictogram 44 comprises, by way of example, an arrowhead directed to the left and an arrowhead directed to the right, by which it is symbolized that the actuation device from FIG. 2 serves for opening and/or closing a door. If the actuation device serves for another purpose, its button 42 accordingly exhibits a different pictogram 44.

FIG. 3 shows the actuation device from FIG. 2 and also a hand 46 of a person.

If the person moves a finger 48 of the hand 46 at a distance from the actuation device through the detection zone of the respective sensor 36, a passage of the finger 48 through the detection zone is detected by the respective sensor 36, and a signal is generated. The sensor signal generated by the sensor unit 28, on the basis of which the evaluation unit 30 checks whether the motion of the finger 48 corresponds to the predetermined contactless actuation gesture, is based on the signals generated by the individual sensors 36.

In FIG. 3, those sensors 36 through the detection zones of which the finger 48 has already been guided by the person have been represented in hatched manner. In order to visualize the portion of the motion of the finger 48 detected hitherto by the sensor unit 28, the visualization device 38 causes those of its luminous devices 40 which have been assigned to these sensors 36 to glow. In FIG. 3, those luminous devices 40 which glow have been represented in hatched manner.

If the finger 48 is being guided through the detection zones of all the sensors 36 of the sensor unit 28, all the luminous devices 40 of the visualization device 38 light up, so that the person is given a visual indication that the contactless gesture executed by the person was successful—that is to say, the contactless gesture executed by the person corresponds to the predetermined contactless actuation gesture by which the actuation device is capable of being actuated.

Where appropriate, the evaluation unit 30 may have been set up to classify the motion of the finger 48 as a predetermined contactless actuation gesture by which the actuation device is capable of being actuated even when not every one of the sensors 36 of the sensor unit 28 detects a passage of the object through its detection zone, for example because one of the sensors 36 is defective or the person's finger 48 has (unintentionally) not passed over one or more sensors 36.

Although the disclosure herein has been illustrated and described in detail by the preferred example embodiment, the disclosure herein is not restricted by the disclosed example, and other variations can be derived therefrom without departing from the scope of protection of the disclosure herein.

The subject matter disclosed herein can be implemented in or with software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An actuation device for a vehicle for public passenger transportation, the actuation device being configured to be actuated by a predetermined contactless actuation gesture, the actuation device comprising:
   a button, by which the actuation device can be actuated;
   a sensor unit comprising a plurality of sensors that are arranged around a perimeter of the button, wherein each sensor of the plurality of sensors is configured to measure, in a contactless manner, the predetermined contactless actuation gesture and to generate a sensor signal;
   an evaluation unit connected to the sensor unit; and
   luminous devices that are arranged around the perimeter of the button;
   wherein the sensor unit is configured to communicate the sensor signal to the evaluation unit when an object is executing a motion at a distance from the actuation device within a detection space of the sensor unit;
   wherein each sensor of the plurality of sensors comprises a detection zone;
   wherein the detection space of the sensor unit comprises the detection zone of each sensor of the plurality of sensors and extends up to a distance of at most 10 cm from the actuation device;
   wherein the sensor signal is dependent on a sequence of movements of the motion; and
   wherein the evaluation unit is configured:
      to check, on a basis of the sensor signal, whether the motion executed by the object is the predetermined contactless actuation gesture by which the actuation device can be actuated; and
      when the evaluation unit determines that the motion executed by the object is the predetermined contactless actuation gesture, to generate a control signal for a device of the vehicle.

2. The actuation device of claim 1, wherein the evaluation unit is configured to classify the motion of the object as the predetermined contactless actuation gesture by which the actuation device can be actuated even when less than all of the plurality of sensors of the sensor unit detects a passage of the object through the detection zone thereof, respectively.

3. The actuation device of claim 1, wherein the sensors are arranged around the perimeter of the button in a form of a circle and the actuation device can be actuated via a circular or substantially circular actuation gesture.

4. The actuation device of claim 1, wherein the plurality of sensors of the sensor unit are infrared sensors.

5. A vehicle for public passenger transportation, comprising one or more actuation device of claim 1.

6. A method of using the actuation device of claim 1 in or on a sanitary room of a vehicle for public passenger transportation for activating a toilet flushing mechanism, for activating an outflow fitting of a washbasin, for activating a hand dryer, or for opening and/or closing a door of the sanitary room.

7. A method of using the actuation device of claim 1 in a vehicle for public passenger transportation for activating a door drive for opening and/or closing a vehicle entry door.

8. A method of using the actuation device of claim 1 in a vehicle for public passenger transportation for activating a flap drive for opening and/or closing a trash-can flap.

9. A method of using the actuation device of claim 1 in a vehicle for public passenger transportation for signaling a stop-request.

10. The actuation device of claim 1, wherein the luminous devices are each in a form of ring segments, such that the luminous devices together form a ring around the perimeter of the button.

11. The actuation device of claim 10, wherein the luminous devices are radially arranged between the perimeter of the button and the plurality of sensors of the sensor unit, such that the ring formed by the luminous devices is between and separates the button from the plurality of sensors of the sensor unit.

12. The actuation device of claim 1, wherein each of the luminous devices is configured to illuminate upon detection of the motion by a corresponding sensor of the plurality of sensors upon detection of the object passing through the detection zone of such corresponding sensor.

13. The actuation device of claim 1, wherein the luminous devices are each configured to illuminate as a function of the sequence of movements of the motion of the object.

14. The actuation device of claim 1, wherein the luminous devices are radially arranged between the perimeter of the button and the plurality of sensors of the sensor unit.

15. The actuation device of claim 1, wherein there is a same quantity of the luminous devices as a quantity of the plurality of sensors, such that there is one luminous device for each sensor.

16. The actuation device of claim 1, wherein:
the luminous devices are each in a form of ring segments, such that the luminous devices together form a ring around the perimeter of the button;
the luminous devices are radially arranged between the perimeter of the button and the plurality of sensors of the sensor unit, such that the ring formed by the luminous devices is between and separates the button from the plurality of sensors of the sensor unit;
each of the luminous devices is configured to illuminate upon detection of the motion by a corresponding sensor of the plurality of sensors upon detection of the object passing through the detection zone of such corresponding sensor;
the luminous devices are each configured to illuminate as a function of the sequence of movements of the motion of the object; and
the luminous devices are radially arranged between the perimeter of the button and the plurality of sensors of the sensor unit.

17. An actuation device for a vehicle for public passenger transportation, the actuation device being configured to be actuated by a predetermined contactless actuation gesture, the actuation device comprising:
a button, by which the actuation device can be actuated;
a sensor unit comprising a plurality of sensors that are arranged around a perimeter of the button, wherein each sensor of the plurality of sensors is configured to measure, in a contactless manner, the predetermined contactless actuation gesture and to generate a sensor signal;
an evaluation unit connected to the sensor unit;
luminous devices that are arranged around the perimeter of the button;
wherein the sensor unit is configured to communicate the sensor signal to the evaluation unit when an object is executing a motion at a distance from the actuation device within a detection space of the sensor unit;
wherein each sensor of the plurality of sensors comprises a detection zone;
wherein the detection space of the sensor unit comprises the detection zone of each sensor of the plurality of sensors and extends up to a distance of at most 7 cm from the actuation device;
wherein the sensor signal is dependent on a sequence of movements of the motion; and
wherein the evaluation unit is configured:
to check, on a basis of the sensor signal, whether the motion executed by the object is the predetermined contactless actuation gesture by which the actuation device can be actuated; and
when the evaluation unit determines that the motion executed by the object is the predetermined contactless actuation gesture, to generate a control signal for a device of the vehicle.

18. The actuation device of claim 17, wherein:
the luminous devices are each in a form of ring segments, such that the luminous devices together form a ring around the perimeter of the button;
the luminous devices are radially arranged between the perimeter of the button and the plurality of sensors of the sensor unit, such that the ring formed by the luminous devices is between and separates the button from the plurality of sensors of the sensor unit;
each of the luminous devices is configured to illuminate upon detection of the motion by a corresponding sensor of the plurality of sensors upon detection of the object passing through the detection zone of such corresponding sensor;
the luminous devices are each configured to illuminate as a function of the sequence of movements of the motion of the object; and
the luminous devices are radially arranged between the perimeter of the button and the plurality of sensors of the sensor unit.

19. An actuation device for a vehicle for public passenger transportation, the actuation device being configured to be actuated by a predetermined contactless actuation gesture, the actuation device comprising:
a button, by which the actuation device can be actuated;
a sensor unit comprising a plurality of sensors that are arranged around a perimeter of the button, wherein each sensor of the plurality of sensors is configured to measure, in a contactless manner, the predetermined contactless actuation gesture and to generate a sensor signal;
an evaluation unit connected to the sensor unit;
luminous devices that are arranged around the perimeter of the button;
wherein the sensor unit is configured to communicate the sensor signal to the evaluation unit when an object is executing a motion at a distance from the actuation device within a detection space of the sensor unit;
wherein each sensor of the plurality of sensors comprises a detection zone;
wherein the detection space of the sensor unit comprises the detection zone of each sensor of the plurality of sensors and extends up to a distance of at most 5 cm from the actuation device;
wherein the sensor signal is dependent on a sequence of movements of the motion; and
wherein the evaluation unit is configured:
to check, on a basis of the sensor signal, whether the motion executed by the object is the predetermined contactless actuation gesture by which the actuation device can be actuated; and
when the evaluation unit determines that the motion executed by the object is the predetermined contactless actuation gesture, to generate a control signal for a device of the vehicle.

20. The actuation device of claim 19, wherein:
the luminous devices are each in a form of ring segments, such that the luminous devices together form a ring around the perimeter of the button;
the luminous devices are radially arranged between the perimeter of the button and the plurality of sensors of the sensor unit, such that the ring formed by the luminous devices is between and separates the button from the plurality of sensors of the sensor unit;
each of the luminous devices is configured to illuminate upon detection of the motion by a corresponding sensor of the plurality of sensors upon detection of the object passing through the detection zone of such corresponding sensor;

the luminous devices are each configured to illuminate as a function of the sequence of movements of the motion of the object; and the luminous devices are radially arranged between the perimeter of the button and the plurality of sensors of the sensor unit.

\* \* \* \* \*